(12) United States Patent
Hsiao et al.

(10) Patent No.: US 8,796,867 B2
(45) Date of Patent: Aug. 5, 2014

(54) SEMICONDUCTOR PACKAGE AND FABRICATION METHOD THEREOF

(75) Inventors: Wei Chung Hsiao, Taichung (TW); Chun Hsien Lin, Taichung (TW); Yu Cheng Pai, Taichung (TW); Liang Yi Hung, Taichung (TW); Ming Chen Sun, Taichung (TW); Shao Tzu Tang, Taichung (TW); Ying Chou Tsai, Taichung (TW); Chang Yi Lan, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 13/588,103

(22) Filed: Aug. 17, 2012

(65) Prior Publication Data

US 2013/0307152 A1    Nov. 21, 2013

(30) Foreign Application Priority Data

May 18, 2012   (TW) .............................. 101117728 A

(51) Int. Cl.
*H01L 23/48* (2006.01)
*H01L 23/52* (2006.01)
*H01L 29/40* (2006.01)

(52) U.S. Cl.
USPC ............ 257/784; 257/700; 257/701

(58) Field of Classification Search
USPC ................... 257/784, 700, 701, 773
See application file for complete search history.

(56) References Cited

U.S. PATENT DOCUMENTS

| | | | |
|---|---|---|---|
| 7,795,071 B2 | 9/2010 | Hwee-Seng Jimmy et al. | |
| 2007/0023896 A1* | 2/2007 | Dangelmaier et al. | 257/728 |
| 2010/0276808 A1* | 11/2010 | Kobayakawa et al. | 257/772 |
| 2010/0295191 A1* | 11/2010 | Kikuchi et al. | 257/784 |
| 2010/0320623 A1* | 12/2010 | Kuroda et al. | 257/784 |
| 2011/0221059 A1* | 9/2011 | Tang et al. | 257/738 |
| 2013/0200533 A1* | 8/2013 | Chau et al. | 257/784 |

* cited by examiner

*Primary Examiner* — S. V. Clark
(74) *Attorney, Agent, or Firm* — Edwards Wildman Palmer LLP; Peter F. Corless; Steven M. Jensen

(57) ABSTRACT

A fabrication method of a semiconductor package is provided, which includes the steps of: forming a packaging substrate on a first carrier; bonding a second carrier to the packaging substrate; removing the first carrier; disposing a chip on the packaging substrate; forming an encapsulant on the packaging substrate for encapsulating the chip; and removing the second carrier. The first and second carriers provide the thin-type packaging substrate with sufficient rigidity for undergoing the fabrication processes without cracking or warpage, thereby meeting the miniaturization requirement and improving the product yield.

10 Claims, 5 Drawing Sheets

US 8,796,867 B2

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application No. 101117728, filed May 18, 2012, the entire contents of which is incorporated herein by reference.

BACKGROUND OF THE INVENTION

1. Field of the Invention

The present invention relates to semiconductor packages and fabrication methods thereof, and, more particularly, to a semiconductor package and a fabrication method thereof for improving the product reliability.

2. Description of Related Art

Semiconductor packaging technologies have been continuously improved to meet the miniaturization requirement of electronic products. A semiconductor package generally includes a packaging substrate, a semiconductor chip disposed on the packaging substrate, an encapsulant encapsulating the semiconductor chip, and a plurality of solder balls for an electronic device to be electrically connected thereto. As such, the overall thickness of the semiconductor package includes the thickness of the encapsulant, the thickness of the packaging substrate and the height of the solder balls. Therefore, reducing the thickness of the packaging substrate has become an important factor to reduce the size of the semiconductor package.

Conventionally, a core layer is formed in the packaging substrate for improving the rigidity of the overall structure, thereby facilitating subsequent chip bonding and encapsulation processes. However, the core layer increases the thickness of the packaging substrate and results in an increased height of the overall package structure.

Accordingly, coreless packaging substrates are developed to meet the miniaturization requirement. FIGS. 1A to 1C are schematic cross-sectional views showing a fabrication method of a semiconductor package 1 as disclosed by U.S. Pat. No. 7,795,071.

Referring to FIG. 1A, a coreless packaging substrate 1a is formed on a carrier (not shown) and then the carrier is removed. The coreless packaging substrate 1a has an insulating protection layer 14 and a circuit layer 13 embedded in the insulating protection layer 14. A lower surface of the circuit layer 13 is flush with a lower surface of the insulating protection layer 14, and an opposite upper surface of the insulating protection layer 14 has a plurality of openings 140 formed therein for exposing a portion of an upper surface of the circuit layer 13.

Referring to FIG. 1B, at least a semiconductor chip 17 is disposed on the lower surface of the insulating protection layer 14 and electrically connected to the circuit layer 13 through a plurality of conductive bumps 170.

Referring to FIG. 1C, a surface finish 12 is formed on the exposed portion of the circuit layer 13 in the openings 140.

By dispensing with a core layer, the fabrication cost and time of the packaging substrate 1a are reduced. On the other hand, the packaging substrate 1a has reduced rigidity due to its reduced thickness. Therefore, the packaging substrate 1a can easily crack during a subsequent chip bonding or encapsulation process, thereby reducing the product yield and reliability.

Further, after the carrier is removed, warpage can easily occur to the packaging substrate 1a so as to cause delamination between the circuit layer 13 and the insulating protection layer 14. As such, the packaging substrate 1a must be discarded, thus increasing the material cost.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a packaging substrate having an insulating protection layer and a circuit layer embedded in the insulating protection layer, wherein the circuit layer comprises a first sub-circuit layer, a second sub-circuit layer and a third sub-circuit layer in sequence and has opposite first and second surfaces, the first surface of the circuit layer is exposed from a surface of the insulating protection layer, and an opposite surface of the insulating protection layer has at least an opening formed therein for exposing a portion of the second surface of the circuit layer; a chip disposed on the packaging substrate and electrically connected to the first surface of the circuit layer; and an encapsulant formed on the packaging substrate for encapsulating the chip.

The present invention further provides a fabrication method of a semiconductor package, which comprises the steps of: forming a circuit layer on a first carrier, wherein the circuit layer has a first surface bonded to the first carrier and a second surface opposite to the first surface; forming an insulating protection layer on the first carrier and the circuit layer and forming at least an opening in the insulating protection layer for exposing a portion of the second surface of the circuit layer; bonding a second carrier to the insulating protection layer; removing the first carrier so as to expose the first surface of the circuit layer and the insulating protection layer; disposing a chip on the insulating protection layer and electrically connecting the chip and the first surface of the circuit layer; forming an encapsulant on the insulating protection layer and the first surface of the circuit layer for encapsulating the chip; and removing the second carrier.

In an embodiment, the first and second carriers can be made of glass fiber (FR4), glass or metal.

In an embodiment, the circuit layer can further comprise a first sub-circuit layer, a second sub-circuit layer and a third sub-circuit layer in sequence.

In an embodiment, the first surface of the circuit layer can be flush with the surface of the insulating protection layer.

In an embodiment, the insulating protection layer can be made of a solder mask material or a molding compound.

In an embodiment, a surface finish or a metal layer can be formed on the circuit layer according to the material structure of the circuit layer. For example, if the first sub-circuit layer is made of gold or silver, the second sub-circuit layer is made of nickel and the third sub-circuit layer is made of copper, the surface finish made of gold or silver can be formed on the second surface of the circuit layer. Alternatively, if the first sub-circuit layer is made of gold, the second sub-circuit layer is made of nickel and the third sub-circuit layer is made of palladium, the metal layer can be made of copper and can be formed on the second surface of the circuit layer, and a surface finish can be selectively formed on the metal layer. The surface finish can be made of Sn, Ag, Ni, Pd, Au, solder, lead-free solder, or a combination thereof.

According to the present invention, the first carrier is used as a support member during the fabrication of the thin-type packaging substrate so as to avoid warpage of the thin-type packaging substrate and hence prevent delamination from occurring between the circuit layer and the insulating protection layer.

Further, after the second carrier is bonded to the thin-type packaging substrate and the first carrier is removed, the second carrier provides the thin-type packaging substrate with sufficient rigidity for effectively undergoing the chip bonding and encapsulation processes without cracking, thereby greatly improving the product yield and reliability.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "upper", "lower", "first", "second", "third", etc. are merely for illustrative purpose and should not be construed to limit the scope of the present invention.

FIGS. 2A to 2J are schematic cross-sectional views showing a fabrication method of a semiconductor package according to a first embodiment of the present invention.

Figure 1A:
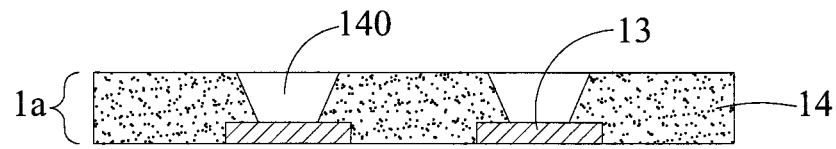
FIGS. 1A to 1C are schematic cross-sectional views showing a fabrication method of a semiconductor package according to the prior art.
Figure 1B:
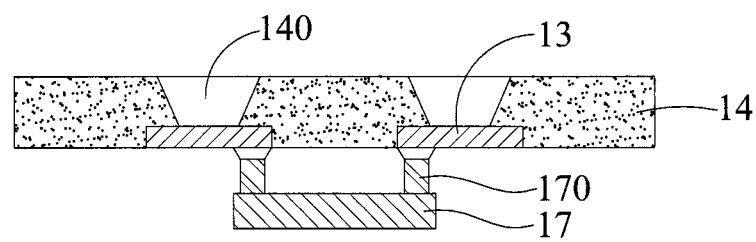
Figure 1C:
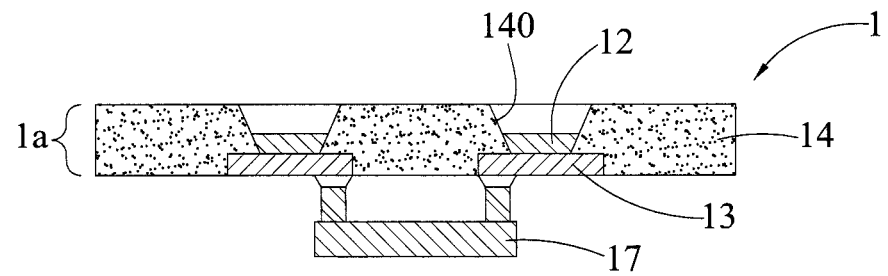
Figure 2A:
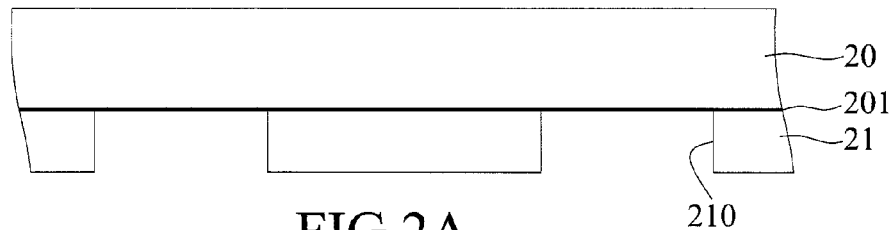
FIGS. 2A to 2J are schematic cross-sectional views showing a fabrication method of a semiconductor package according to a first embodiment of the present invention, wherein FIG. 2I' shows another embodiment of FIG. 2I, and FIG. 2J' shows another embodiment of FIG. 2J.

Referring to FIG. 2A, a first carrier 20 is provided and a conductive layer 201 is formed on the first carrier 20.

In an embodiment, the first carrier 20 is made of glass fiber (FR4), glass or metal. The conductive layer 201 serves as a current conductive path for a subsequent electroplating process.

Then, a resist layer 21 is formed on the conductive layer 201 and patterned such that a plurality of openings 210 are formed in the resist layer 21 for exposing a portion of the conductive layer 201.

Figure 2B:
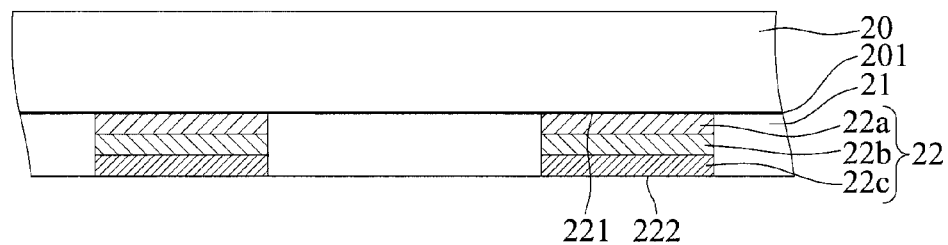

Referring to FIG. 2B, a circuit layer 22 having opposite first and second surfaces 221 and 222 is formed on the exposed portion of the conductive layer 201. The circuit layer 22 has a first sub-circuit layer 22a, a second sub-circuit layer 22b and a third sub-circuit layer 22c sequentially formed on the conductive layer 201.

In an embodiment, the first sub-circuit layer 22a is made of gold or silver, the second sub-circuit layer 22b is made of nickel, and the third sub-circuit layer 22c is made of copper.

Figure 2C:
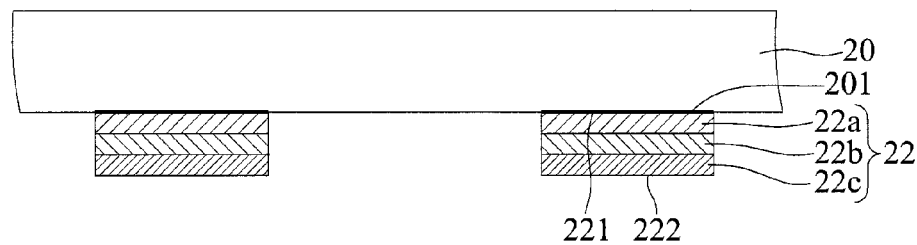

Referring to FIG. 2C, the resist layer 21 and the portion of the conductive layer 201 on the resist layer 21 are removed.

Figure 2D:
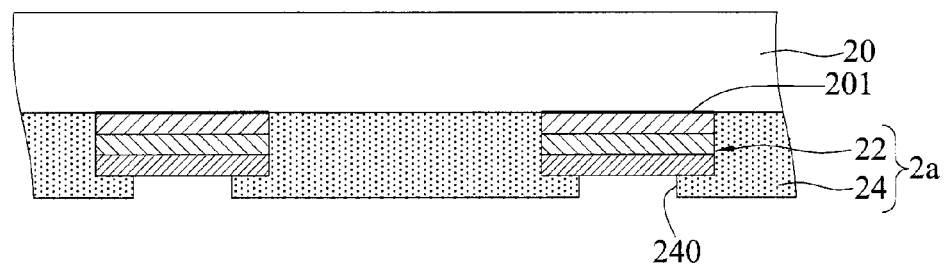

Referring to FIG. 2D, an insulating protection layer 24 is formed on the first carrier 20 and the circuit layer 22, and a plurality of openings 240 are formed in the insulating protection layer 24 for exposing a portion of the second surface 222 of the circuit layer 22, thereby obtaining a thin-type packaging substrate 2a. In an embodiment, the insulating protection layer 24 is made of a solder mask material. In another embodiment, the insulating protection layer 24 is made of a molding compound.

Figure 2E:
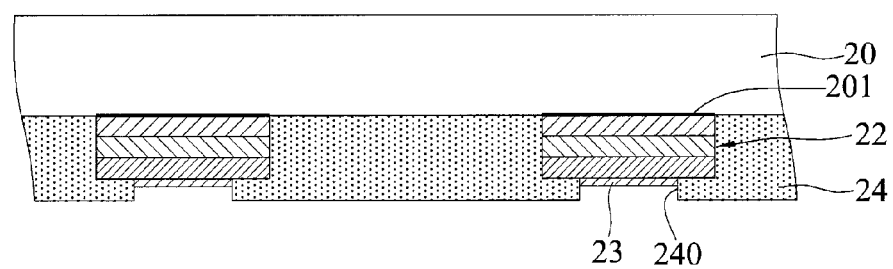

Referring to FIG. 2E, a surface finish 23 is formed on the exposed portion of the second surface 222 of the circuit layer 22 in the openings 240. The surface finish 23 can be made of gold or silver.

Figure 2F:
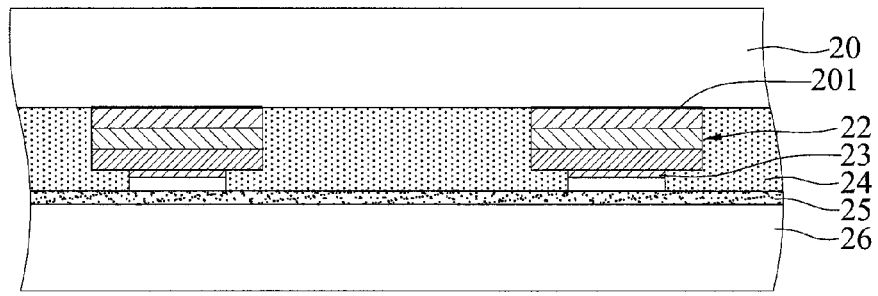
Figure 2G:
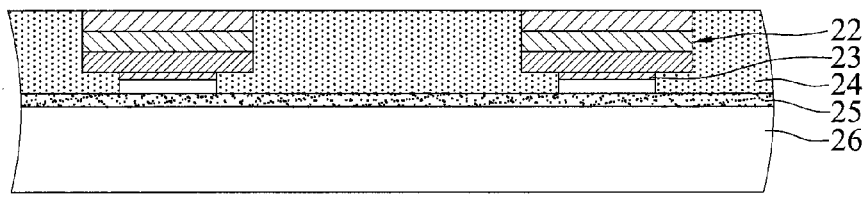

Referring to FIG. 2F, a second carrier 26 is bonded to the insulating protection layer 24 through an adhesive layer 25 so as to support the thin-type packaging substrate 2a, thereby providing the packaging substrate 2a with preferred rigidity during subsequent processes and hence improving the product yield.

In an embodiment, the second carrier 26 is made of glass or metal.

Referring to FIG. 2O, the first carrier 20 and the remaining portion of the conductive layer 201 are removed to expose the first surface 221 of the circuit layer 22 and the insulating protection layer 24.

In an embodiment, the first surface 221 of the circuit layer 22 is flush with the surface of the insulating protection layer 24.

Figure 2H:
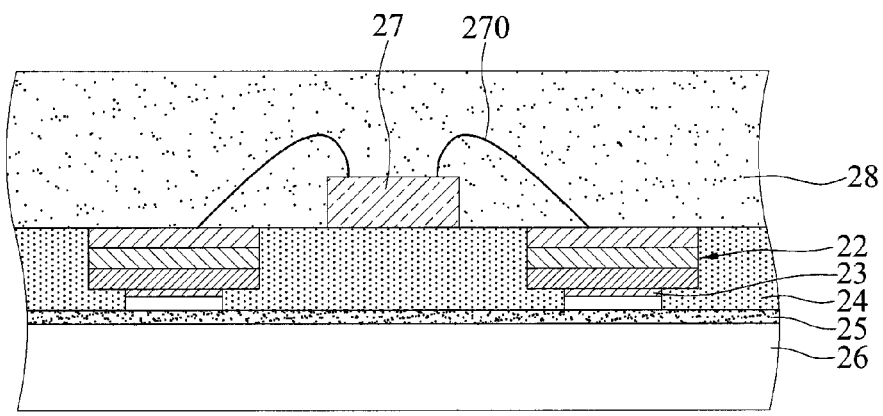

Referring to FIG. 2H, at least a chip 27 is disposed on the insulating protection layer 24 and electrically connected to the circuit layer 22 through a plurality of bonding wires 270.

Then, an encapsulant 28 is formed on the insulating protection layer 24 to encapsulate the chip 27, the bonding wires 270 and the circuit layer 22.

In an embodiment, the encapsulant 28 can be made of polyimide (PI) by coating. In another embodiment, the encapsulant 28 can be formed through lamination or molding. But it should be noted that the encapsulant is not limited to the above-described material.

Figure 2I:
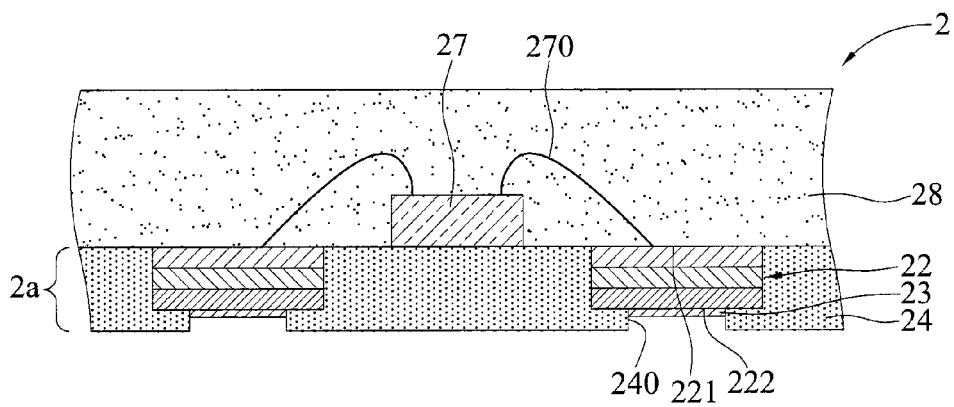
Figure 2I:
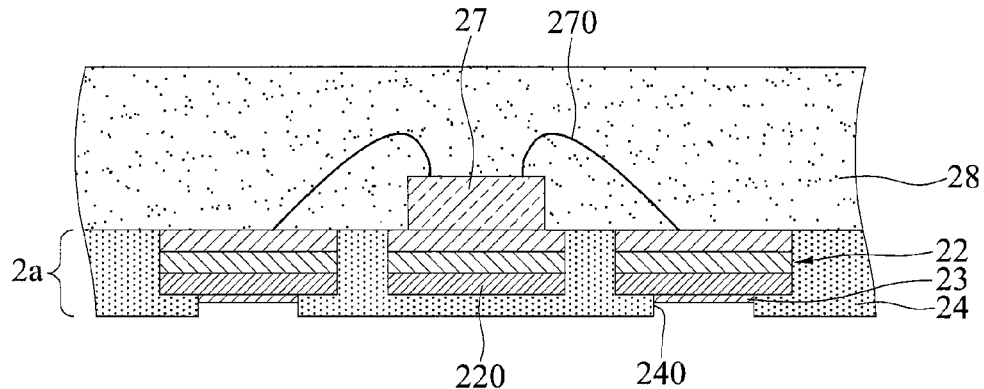

Referring to FIG. 2I, the second carrier 26 and the adhesive layer 25 are removed to expose the surface finish 23, thus obtaining a semiconductor package 2.

In another embodiment, referring to FIG. 2I', during the formation of the circuit layer 22, a die attach pad 220 can be formed so as for the chip 27 to be disposed thereon.

Figure 2J:
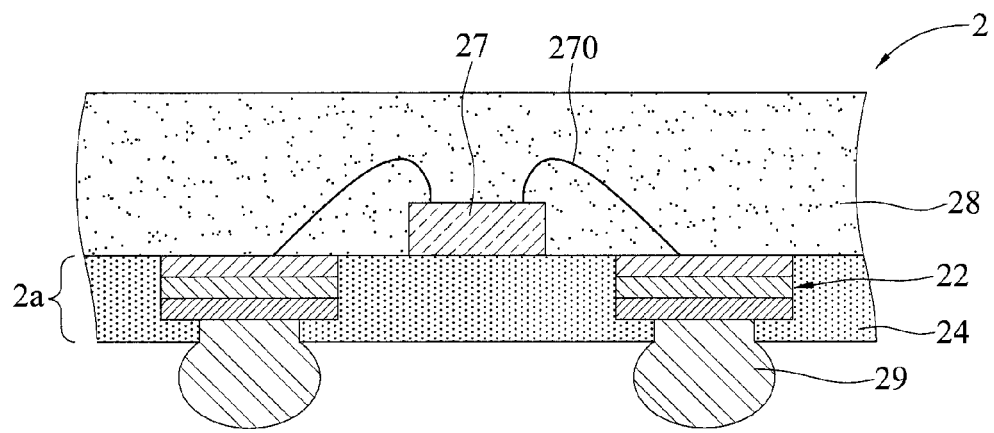
Figure 2J:
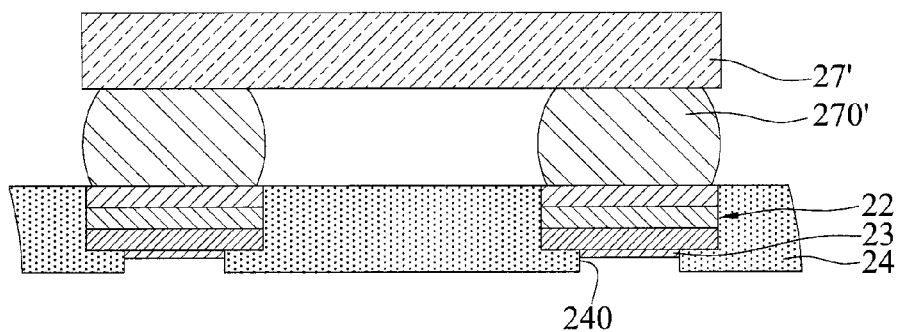

Referring to FIG. 2J, a plurality of conductive elements 29 such as solder balls are formed on the surface finish 23 through ball mounting and reflow. Therefore, the semiconductor package 2 can be electrically connected to an electronic device such as a circuit board through the conductive elements 29.

According to the above-described method, the first carrier 20 is used as a support member during the fabrication of the packaging substrate 2a so as to avoid warpage of the packaging substrate 2a and hence prevent delamination from occurring between the circuit layer 22 and the insulating protection layer 24.

Further, after the package substrate 2a is fabricated, the second carrier 26 is bonded to the packaging substrate 2a and then the first carrier 20 is removed. As such, the second carrier 26 can be used to support the packaging substrate 2a during the subsequent chip bonding and encapsulation processes.

Therefore, a thin-type packaging substrate 2a can be provided. The second carrier 26 provides the packaging substrate 2a with sufficient rigidity for undergoing the subsequent chip bonding and encapsulation processes without cracking, thus improving the product yield and reliability.

In another embodiment, a chip 27' can be electrically connected to the circuit layer 22 through a plurality of conductive bumps 270' in a flip-chip manner, as shown in FIG. 2J'.

FIGS. 3A to 3D are schematic cross-sectional views showing a fabrication method of a semiconductor package 3 according to a second embodiment of the present invention. The second embodiment differs from the first embodiment in that the circuit layer and the surface finish of the second embodiment have different structures.

Figure 3A:
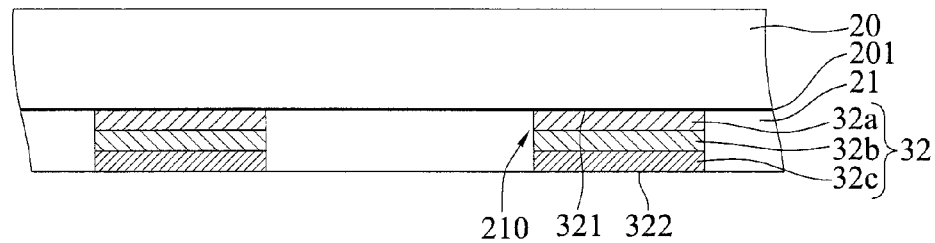
FIGS. 3A to 3D are schematic cross-sectional views showing a fabrication method of a semiconductor package according to a second embodiment of the present invention, wherein FIG. 3C' shows another embodiment of FIG. 3C.

Referring to FIG. 3A, continued from FIG. 2A, a circuit layer 32 having opposite first and second surfaces 321 and 322 is formed on the exposed portion of the conductive layer 201 in the openings 210 of the resist layer 21. The circuit layer 32 has a first sub-circuit layer 32a, a second sub-circuit layer 32b and a third sub-circuit layer 32c in sequence.

In an embodiment, the first sub-circuit layer 32a is made of gold, the second sub-circuit layer 32b is made of nickel, and the third sub-circuit layer 32c is made of palladium.

Figure 3B:
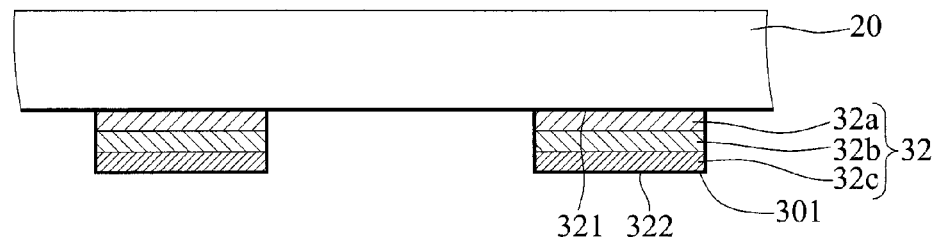

Referring to FIG. 3B, the resist layer 21 is removed, and a metal layer 301 is formed on the first carrier 20 and the circuit layer 32 through an electroless plating process. In an embodiment, the metal layer 301 is made of copper.

Figure 3C:
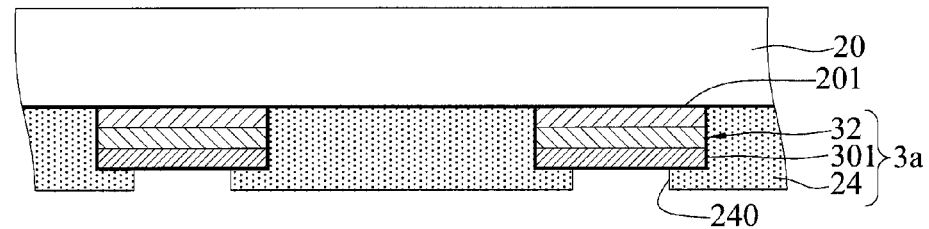
Figure 3C:
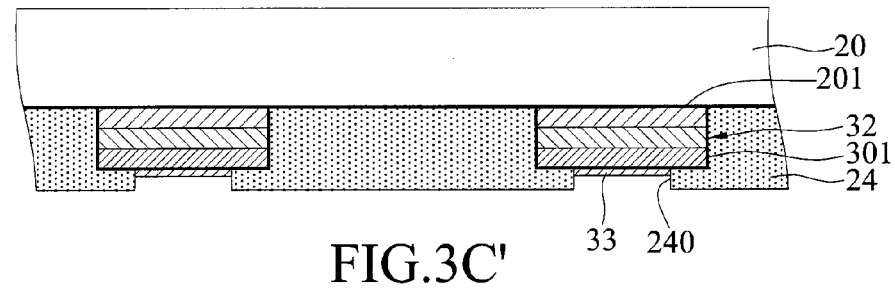

Referring to FIG. 3C, an insulating protection layer 24 is formed on the first carrier 20 and the circuit layer 32, and a plurality of openings 240 are formed in the insulating protection layer 24 for exposing a portion of the metal layer 301, thereby obtaining a thin-type packaging substrate 3a.

In another embodiment, a surface finish 33 can be selectively formed on the metal layer 301 in the openings 240, as shown in FIG. 3C'. The surface finish 33 is made of Sn, Ag, Ni, Pd, Au, solder, lead-free solder, or a combination thereof.

Figure 3D:
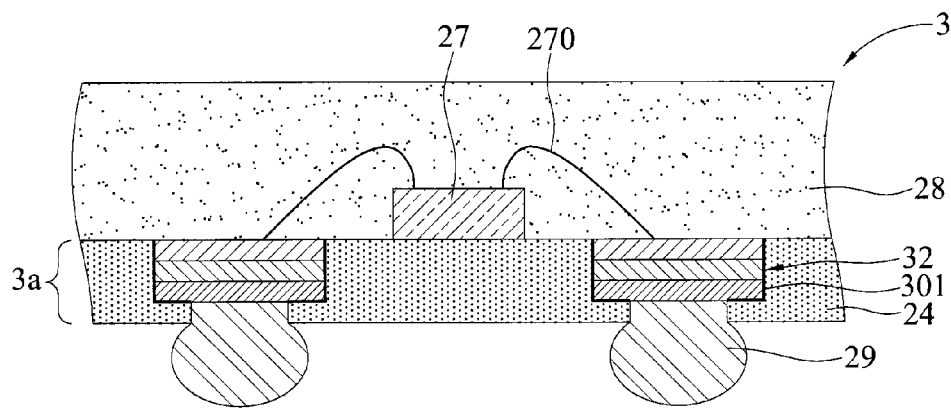

Referring to FIG. 3D, by performing the processes of FIGS. 2F to 2J, chip bonding and encapsulation processes are performed to form a semiconductor package 3.

The present invention provides a semiconductor package 2, 3, which has: a packaging substrate 2a, 3a; a chip 27 disposed on the packaging substrate 2a, 3a; and an encapsulant 28 formed on the packaging substrate 2a, 3a for encapsulating the chip 27.

The packaging substrate 2a, 3a has an insulating protection layer 24, and a circuit layer 22, 32 embedded in the insulating protection layer 24 and having a first surface 221, 321 and a second surface 222, 322 opposite to the first surface 221, 321. The first surface 221, 321 of the circuit layer 22, 32 is exposed from and flush with the insulating protection layer 24. A surface finish 23, 33 or a metal layer 301 can be formed on the second surface 222, 322 of the circuit layer 22, 32. The insulating protection layer 24 further has a plurality of openings 240 for exposing a portion of the surface finish 23, 33 or the metal layer 301.

In an embodiment, the circuit layer 22, 32 has a first sub-circuit layer 22a, 32a, a second sub-circuit layer 22b, 32b and a third sub-circuit layer 22c, 32c. In an embodiment, the first sub-circuit layer 22a is made of gold or silver, the second sub-circuit layer 22b is made of nickel, and the third sub-circuit layer 22c is made of copper. In another embodiment, the first sub-circuit layer 32a is made of gold, the second sub-circuit layer 32b is made of nickel, and the third sub-circuit layer 32c is made of palladium. The insulating protection layer 24 can be made of a solder mask material or a molding compound.

The chip 27 is electrically connected to the circuit layer 22, 32. In an embodiment, the chip 27 is electrically connected to the circuit layer 22, 32 through a plurality of bonding wires 270. The circuit layer 22 further has a die attach pad 220 for the chip 27 to be disposed thereon. In another embodiment, a chip 27' is electrically connected to the circuit layer 22 through a plurality of conductive bumps 270' in a flip-chip manner.

Further, the surface finish 23, 33 or the metal layer 301 is exposed from the openings 240 of the encapsulant 28 so as for conductive elements 29 to be mounted thereon and an electronic device such as a circuit board to be electrically connected to the conductive elements 29. In an embodiment, the metal layer 301 is made of copper.

According to the present invention, the first and second carriers can provide the packaging substrate with preferred rigidity for undergoing each of the fabrication processes without warpage or cracking, thereby meeting the miniaturization requirement, improving the product reliability and saving the material cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a packaging substrate having an insulating protection layer and a circuit layer embedded in the insulating protection layer, wherein the circuit layer comprises a first sub-circuit layer, a second sub-circuit layer and a third sub-circuit layer in sequence and has opposite first and second surfaces, the first surface of the circuit layer is exposed from a surface of the insulating protection layer, and an opposite surface of the insulating protection layer has at least an opening formed therein for exposing a portion of the second surface of the circuit layer;
   a chip disposed on the packaging substrate and electrically connected to the first surface of the circuit layer; and
   an encapsulant formed on the packaging substrate for encapsulating the chip,
   wherein the first sub-circuit layer is made of gold or silver, the second sub-circuit layer is made of nickel, and the third sub-circuit layer is made of copper.

2. The semiconductor package of claim 1, wherein the first surface of the circuit layer is flush with the surface of the insulating protection layer.

3. The semiconductor package of claim 1, wherein the second surface of the circuit layer has a surface finish formed thereon.

4. The semiconductor package of claim 3, wherein the surface finish is made of gold or silver.

5. The semiconductor package of claim 1, wherein the first sub-circuit layer is made of gold, the second sub-circuit layer is made of nickel, and the third sub-circuit layer is made of palladium.

6. The semiconductor package of claim 5, wherein the second surface of the circuit layer has a metal layer formed thereon.

7. The semiconductor package of claim 6, wherein the metal layer is made of copper.

8. The semiconductor package of claim 6, further comprising a surface finish formed on the metal layer.

9. The semiconductor package of claim 8, wherein the surface finish is made of Sn, Ag, Ni, Pd, Au, solder, lead-free solder, or a combination thereof.

10. The semiconductor package of claim 1, wherein the insulating protection layer is made of a solder mask material or a molding compound.

* * * * *